US012176445B2

(12) United States Patent
Westerberg et al.

(10) Patent No.: US 12,176,445 B2
(45) Date of Patent: Dec. 24, 2024

(54) METALLIZATION OF SOLAR CELLS WITH DIFFERENTIATED P-TYPE AND N-TYPE REGION ARCHITECTURES

(71) Applicant: Maxeon Solar Pte. Ltd., Singapore (SG)

(72) Inventors: Staffan Westerberg, Sunnyvale, CA (US); Gabriel Harley, Mountain View, CA (US)

(73) Assignee: Maxeon Solar Pte. Ltd., Singapore (SG)

( * ) Notice: Subject to any disclaimer, the term of this patent is extended or adjusted under 35 U.S.C. 154(b) by 203 days.

(21) Appl. No.: 17/738,978

(22) Filed: May 6, 2022

(65) Prior Publication Data

US 2022/0262965 A1  Aug. 18, 2022

Related U.S. Application Data

(62) Division of application No. 14/672,067, filed on Mar. 27, 2015, now Pat. No. 11,355,657.

(51) Int. Cl.
*H01L 31/0236* (2006.01)
*H01L 31/0216* (2014.01)
(Continued)

(52) U.S. Cl.
CPC .. *H01L 31/02363* (2013.01); *H01L 31/02167* (2013.01); *H01L 31/022425* (2013.01);
(Continued)

(58) Field of Classification Search
CPC ................................................. H01L 31/02363
See application file for complete search history.

(56) References Cited

U.S. PATENT DOCUMENTS 3,969,746 A  7/1976 Kendall et al.
5,334,259 A * 8/1994 Mizumura ............ H01L 31/046
 257/E27.125
(Continued)

FOREIGN PATENT DOCUMENTS

CN 102725858 10/2012
CN 102906883 1/2013
(Continued)

OTHER PUBLICATIONS

International Search Report and Written Opinion from PCT/US2016/023641 mailed Jun. 29, 2016, 16 pgs.
(Continued)

*Primary Examiner* — Sadie White
(74) *Attorney, Agent, or Firm* — Schwabe, Williamson & Wyatt, P.C.

(57) ABSTRACT

Methods of fabricating solar cell emitter regions with differentiated P-type and N-type region architectures, and resulting solar cells, are described. In an example a solar cell includes a first emitter region of a first conductivity type disposed on a first dielectric region, the first dielectric region disposed on a surface of a substrate. A second dielectric region is disposed laterally adjacent to the first and second emitter region. The second emitter region of a second, different, conductivity type is disposed on a third dielectric region, the third dielectric region disposed on the surface of the substrate, over the second dielectric region, and partially over the first emitter region. A first metal foil is disposed over the first emitter region. A second metal foil is disposed over the second emitter region.

14 Claims, 4 Drawing Sheets

(51) Int. Cl.
  *H01L 31/0224* (2006.01)
  *H01L 31/18* (2006.01)
(52) U.S. Cl.
  CPC .. *H01L 31/022441* (2013.01); *H01L 31/1804* (2013.01); *Y02E 10/547* (2013.01); *Y02P 70/50* (2015.11)

(56) References Cited

U.S. PATENT DOCUMENTS

| | | | |
|---|---|---|---|
| 7,718,888 | B2 | 5/2010 | Cousins |
| 7,737,357 | B2 | 6/2010 | Cousins |
| 8,679,889 | B2 | 3/2014 | Cousins et al. |
| 8,815,631 | B2 | 8/2014 | Cousins |
| 9,252,301 | B2 | 2/2016 | Morigami et al. |
| 9,257,593 | B2 | 2/2016 | Hashiguchi et al. |
| 9,269,839 | B2 | 2/2016 | Lee et al. |
| 9,362,426 | B2 | 6/2016 | Goto et al. |
| 2002/0011641 | A1* | 1/2002 | Oswald ............... H01L 31/0463 438/96 |
| 2008/0035198 | A1 | 2/2008 | Teppe et al. |
| 2008/0216887 | A1 | 9/2008 | Hacke et al. |
| 2010/0139764 | A1* | 6/2010 | Smith ............... H01L 31/0682 136/258 |
| 2010/0154873 | A1 | 6/2010 | Hilali et al. |
| 2010/0229928 | A1 | 9/2010 | Zuniga et al. |
| 2011/0000532 | A1* | 1/2011 | Niira ............... H01L 31/0747 257/E31.13 |
| 2011/0012222 | A1* | 1/2011 | Cho ............... H01L 31/0312 257/E31.043 |
| 2011/0041911 | A1 | 2/2011 | Lee et al. |
| 2011/0056545 | A1* | 3/2011 | Ji ............... H01L 31/0747 136/255 |
| 2011/0214719 | A1* | 9/2011 | Li ............... H01L 31/18 257/E31.13 |
| 2011/0284986 | A1 | 11/2011 | Rim et al. |
| 2012/0125433 | A1 | 5/2012 | Guha et al. |
| 2012/0204938 | A1 | 8/2012 | Hacke et al. |
| 2013/0037102 | A1* | 2/2013 | Isaka ............... H01L 31/0682 257/E31.124 |
| 2013/0045562 | A1 | 2/2013 | Liu et al. |
| 2013/0164879 | A1 | 6/2013 | Cousins et al. |
| 2013/0186456 | A1 | 7/2013 | Ide et al. |
| 2013/0240029 | A1 | 9/2013 | Smith |
| 2013/0247970 | A1 | 9/2013 | Morigami et al. |
| 2014/0020752 | A1 | 1/2014 | Arimoto et al. |
| 2014/0096821 | A1 | 4/2014 | Chen et al. |
| 2015/0280029 | A1 | 10/2015 | Harley et al. |
| 2016/0056322 | A1 | 2/2016 | Yang et al. |
| 2016/0126368 | A1 | 5/2016 | Lee et al. |
| 2016/0155866 | A1 | 6/2016 | Ha et al. |
| 2016/0155877 | A1 | 6/2016 | Chung et al. |
| 2016/0155885 | A1 | 6/2016 | Shim et al. |
| 2016/0181461 | A1 | 6/2016 | Ueyama et al. |
| 2016/0197210 | A1 | 7/2016 | Hayashi et al. |
| 2016/0240704 | A1 | 8/2016 | Shim |
| 2016/0240705 | A1 | 8/2016 | Takahama |
| 2016/0268454 | A1 | 9/2016 | Gwon |

FOREIGN PATENT DOCUMENTS

| | | |
|---|---|---|
| TW | 201344931 | 11/2013 |
| WO | WO 2013096500 | 6/2016 |

OTHER PUBLICATIONS

First Action Interview Pre-Interview Communication from U.S. Appl. No. 14/672,067 dated Oct. 17, 2016, 9 pgs.
Final Office Action from U.S. Appl. No. 14/672,067 dated Oct. 3, 2017, 12 pgs.
International Preliminary Report on Patentability from PCT/US2016/023641 mailed Oct. 12, 2017, 12 pgs.
Non-Final Office Action from U.S. Appl. No. 14/672,067 dated Feb. 26, 2018, 13 pgs.
Final Office Action from U.S. Appl. No. 14/672,067 dated Sep. 7, 2018, 10 pgs.
Non-Final Office Action from U.S. Appl. No. 14/672,067 dated Jun. 12, 2019, 12 pgs.
Final Office Action from U.S. Appl. No. 14/672,067 dated Dec. 5, 2019, 13 pgs.
Office Action from Taiwan Patent Application No. 105109090 dated Feb. 24, 2020, 12 pgs.
Non-Final Office Action from U.S. Appl. No. 14/672,067 dated May 19, 2020, 16 pgs.
Final Office Action from U.S. Appl. No. 14/672,067 dated Jan. 13, 2021, 17 pgs.
First Action Interview Office Action from U.S. Appl. No. 14/672,067 dated Jan. 19, 2017, 5 pgs.

* cited by examiner

METALLIZATION OF SOLAR CELLS WITH DIFFERENTIATED P-TYPE AND N-TYPE REGION ARCHITECTURES

CROSS-REFERENCE TO RELATED APPLICATIONS

This application is a Divisional of U.S. patent application Ser. No. 14/672,067, filed on Mar. 27, 2015, the entire contents of which are hereby incorporated by reference herein.

BACKGROUND

Photovoltaic (PV) cells, commonly known as solar cells, are devices for conversion of solar radiation into electrical energy. Generally, solar radiation impinging on the surface of, and entering into, the substrate of a solar cell creates electron and hole pairs in the bulk of the substrate. The electron and hole pairs migrate to p-doped and n-doped regions in the substrate, thereby creating a voltage differential between the doped regions. The doped regions are connected to the conductive regions on the solar cell to direct an electrical current from the cell to an external circuit. When PV cells are combined in an array such as a PV module, the electrical energy collect from all of the PV cells can be combined in series and parallel arrangements to provide power with a certain voltage and current.

Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency of solar cells, or techniques for increasing the efficiency in the manufacture of solar cells, are generally desirable. Some embodiments of the present disclosure allow for increased solar cell manufacture efficiency by providing novel processes for fabricating solar cell structures. Some embodiments of the present disclosure allow for increased solar cell efficiency by providing novel solar cell structures.

DETAILED DESCRIPTION

Figure 1:
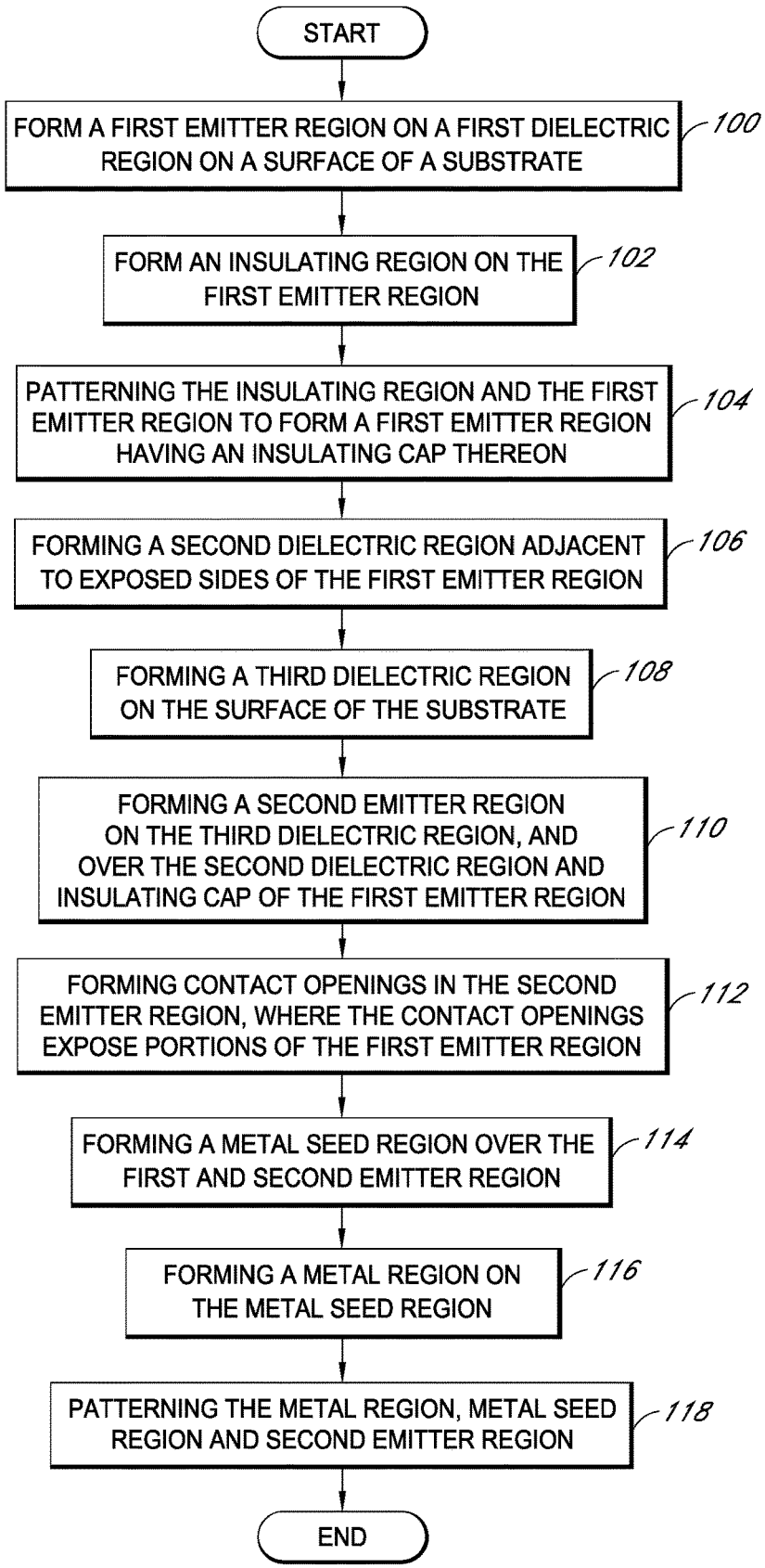
FIG. 1 illustrates a flow chart representation of an example method for fabricating of a solar cell, according to some embodiments.

The following detailed description is merely illustrative in nature and is not intended to limit the embodiments of the subject matter of the application or uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" emitter region does not necessarily imply that this emitter region is the first emitter region in a sequence; instead the term "first" is used to differentiate this emitter region from another emitter region (e.g., a "second" emitter region). In an embodiment, an emitter region can be a doped region of a solar cell for collecting positive and negative charge carriers. In an example, the emitter region can be a doped polysilicon region. In one example, the emitter region can be a P-type doped polysilicon region or an N-type doped polysilicon region.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard"

describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

In the following description, numerous specific details are set forth, such as specific operations, in order to provide a thorough understanding of embodiments of the present disclosure. It will be apparent to one skilled in the art that embodiments of the present disclosure may be practiced without these specific details. In other instances, well-known techniques are not described in detail in order to not unnecessarily obscure embodiments of the present disclosure.

This specification first describes solar cell fabrication techniques to improve solar cell efficiency followed by a description of example solar cells fabricated according to the disclosed techniques. Various embodiments are provided throughout.

Turning now to FIG. 1, a method for fabricating a solar cell is shown, according to some embodiments. In various embodiments, the method of FIG. 1 can include additional (or fewer) blocks than illustrated. For example, in some embodiments, a metal seed region need not be formed and a metal region can instead be formed directly over the first and second emitter region.

Figure 2:
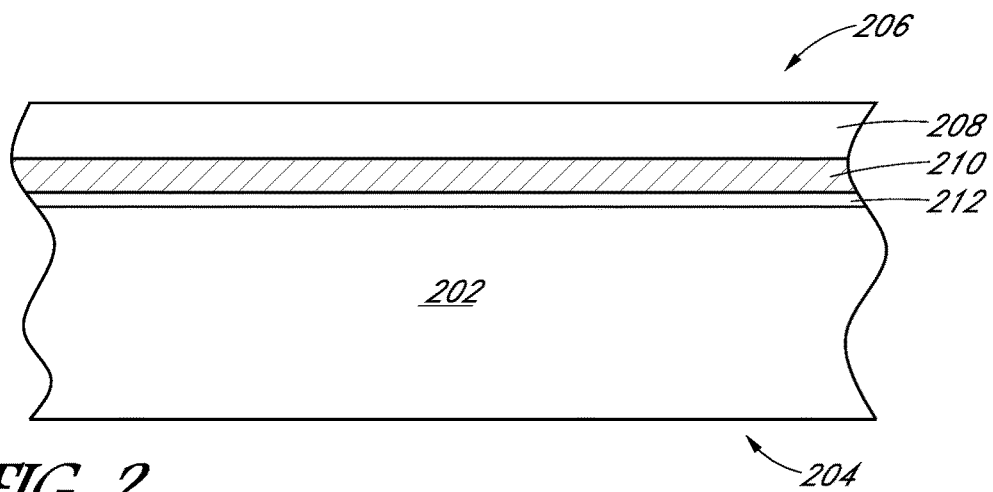
FIGS. 2-8 illustrate cross-sectional views of example solar cells during the fabrication process of FIG. 1, according to some embodiments.

Referring to FIG. 2, and corresponding operation 100 of the flowchart of FIG. 1, a first emitter region 210 is formed on a first dielectric region 212 on a surface of a substrate 202, according to some embodiments. In an embodiment, the substrate 202 has a front side 204 and a back side 206 opposite the front side 204. In an embodiment, the substrate 202 is a silicon substrate. In some embodiments, the silicon substrate can be cleaned, polished, planarized, and/or thinned or otherwise processed prior to the formation of the dielectric region. In an embodiment, the silicon substrate can be single-crystalline or a multicrystalline silicon substrate. In an embodiment, the silicon substrate can be a N-type silicon substrate. In one embodiment, the silicon substrate can be a P-type silicon substrate.

In an embodiment, the first dielectric region 212 can be a tunneling dielectric. In one embodiment, the first dielectric region 212 can be silicon oxide, silicon nitride or silicon oxynitride among other examples. In an embodiment, the first dielectric region 212 can be grown and/or formed through a thermal process. In an embodiment, the first dielectric region 212 can have a thickness of 5-30 Angstroms.

In an embodiment, the first emitter region 210 can be an amorphous silicon region. In some embodiments, the amorphous silicon region can be grown over the first dielectric region 212. In an embodiment, the first emitter region 210 can be polysilicon. In an embodiment, the first emitter region 210 can be grown and/or formed through a thermal process. In an example, an amorphous silicon region can be formed over the first dielectric region 212 and heated to form a polysilicon first emitter region 210. In one example, an annealing process can be performed to form the first emitter region 210 into a polysilicon first emitter region.

As shown in FIG. 2 and referring to the corresponding operation 102 of the flowchart of FIG. 1, an insulating region 208 can be formed on the first emitter region 210. In an embodiment the insulating region 208 can be silicon oxide. In an embodiment, the insulating region 208 can have a thickness in the range of 1000-4000 Angstroms.

Figure 3:
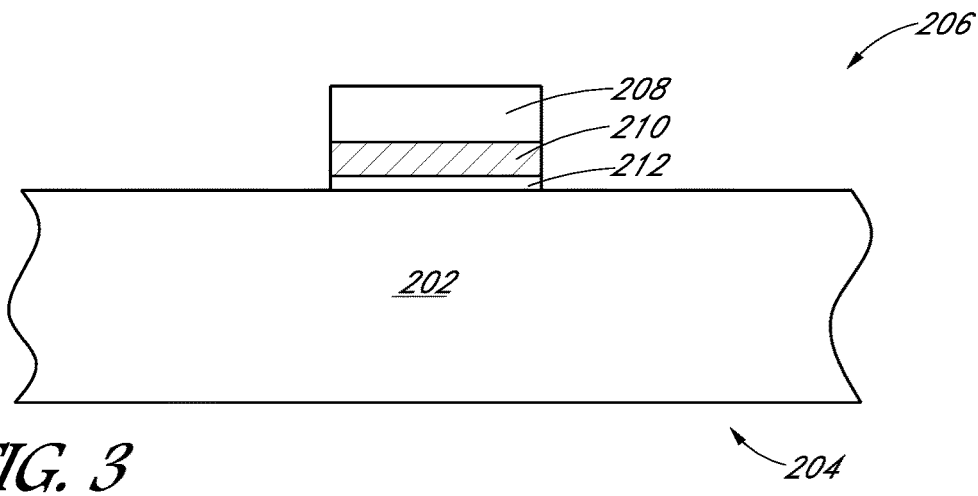

FIG. 3, and corresponding operation 104 of the flowchart of FIG. 1, illustrates patterning the insulating region 208 and the first emitter region 210 to form a first emitter region 210 having an insulating cap 208 thereon, according to some embodiments. In an embodiment, a lithographic or screen print masking and subsequent etch process can be used to pattern the insulating region 208 and the first emitter region 210. In one embodiment, the patterning includes a wet etching process. In an example, the patterning can use a chemical etchant to etch the insulating region 208 and the first emitter region 210. In one embodiment, a laser ablation process can be used to pattern the insulating region 208 and the first emitter region 210. In either case, in one embodiment, the first dielectric region 212 is also patterned in the process, as is depicted in FIG. 3.

In an embodiment, a sacrificial layer can be formed on the insulating region 208 to prevent damage to the insulating region 208 during the patterning. In an example, the sacrificial layer can be patterned on the insulating region 208 to prevent etching of portions of the insulating region 208 and allow other portions to etch, e.g., exposed regions of the insulating region 208, during a wet etching process. In one embodiment, the sacrificial layer be configured to prevent damage to the insulating region from a laser ablation process. In an embodiment, the sacrificial layer can be silicon nitride. In an example, the sacrificial layer can have a thickness in the range of 50-500 Angstroms. In an embodiment, the insulating region can be silicon oxide. In an example, the insulating region can have a thickness in the range of 500-1500 Angstroms. In an embodiment, the sacrificial layer can be removed after the patterning process.

Figure 4:
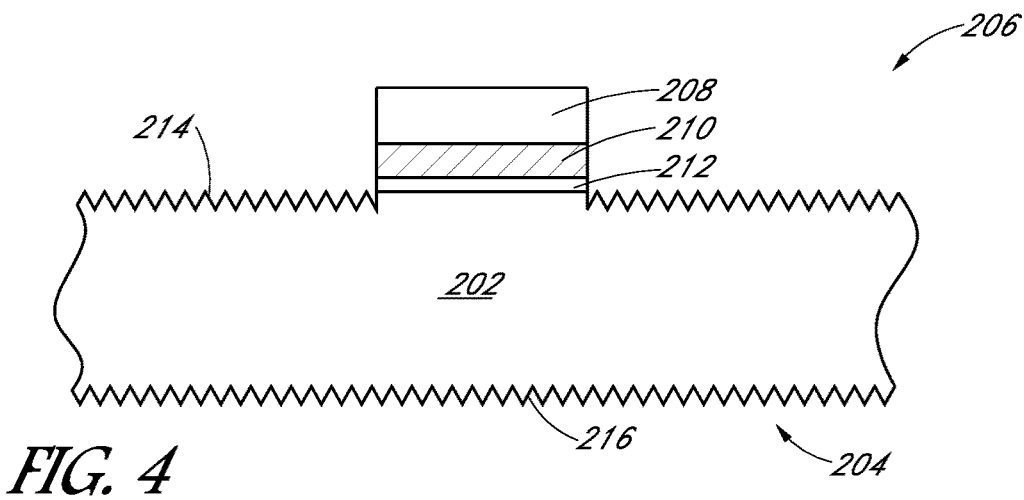

Turning now to FIG. 4, optionally, a textured surface 214 may be formed on the substrate 202 during (or subsequent to) the patterning of the insulating layer 208 and the first emitter region 210, according to some embodiments. In a same or similar process, a light receiving surface, for example the front side 204 the substrate 202 may also be texturized 216, as is depicted in FIG. 4. In an embodiment, a hydroxide-based wet etchant can be used to form at least a portion of the textured surfaces 214, 216 and/or to texturize exposed portions of the substrate 202. A texturized surface may be one which has a regular or an irregular shaped surface for scattering incoming light, decreasing the amount of light reflected off of the light-receiving and/or exposed surfaces of the solar cell. It is to be appreciated, however, that the texturizing of the back and/or front surfaces 206, 204 and even the texturized surface 214, 216 formation may be omitted from the process flow.

Figure 5:
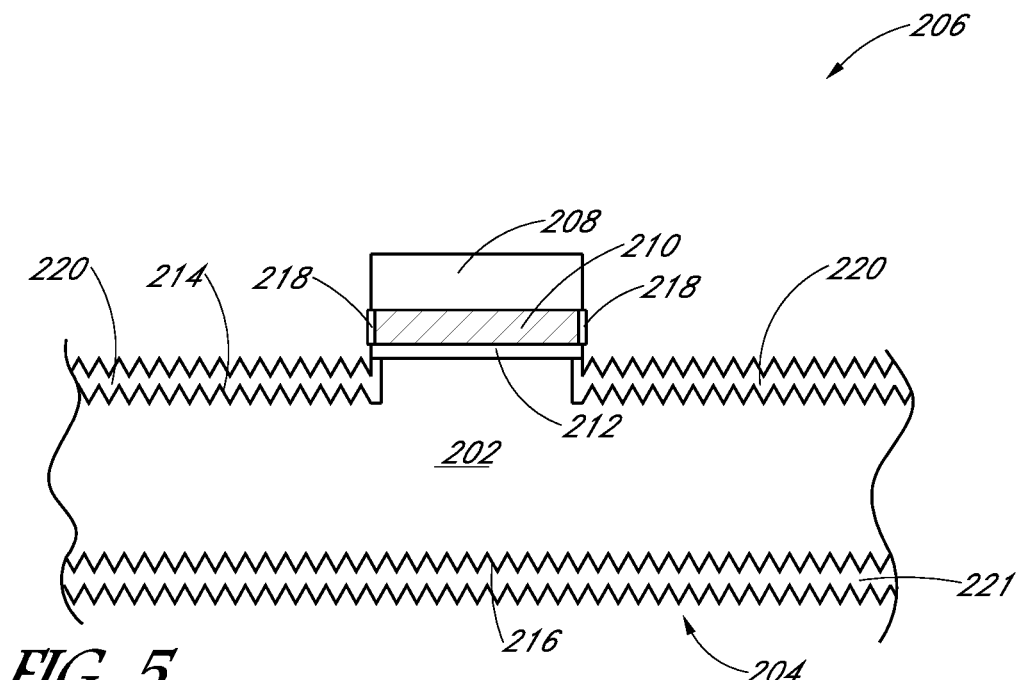

FIG. 5, and corresponding operation 106 of the flowchart of FIG. 1, illustrates forming a second dielectric region 218 adjacent to exposed sides of the first emitter region 210, according to some embodiments. In an embodiment, the second dielectric region 218 is formed in an oxidation process and is a thin oxide such as a tunnel dielectric (e.g., silicon oxide) having a thickness of approximately 2 nanometers or less. In another embodiment, the second dielectric region 218 is formed in a deposition process and is a thin silicon nitride or silicon oxynitride. In an example, the silicon nitride and/or silicon oxynitride can have a thickness of approximately 40 Angstroms or less.

Referring again to FIG. 5, and now to corresponding operation 108 of the flowchart of FIG. 1, a third dielectric region 220 is formed on a surface of the substrate 202, according to some embodiments. In an embodiment, the third dielectric region 220 is formed in an oxidation process and is a thin oxide such as a tunnel dielectric (e.g., silicon oxide) having a thickness of approximately 2 nanometers or less. In another embodiment, the third dielectric region 220 is formed in a deposition process and is a thin silicon nitride or silicon oxynitride. In an example, the silicon nitride and/or silicon oxynitride can have a thickness of approximately 40 Angstroms. In one embodiment, the second and third dielectric are formed in the same step and/or process. In an embodiment, the second and third dielectric are the same material (e.g., silicon oxide, silicon nitride and/or silicon oxynitride).

Figure 6:
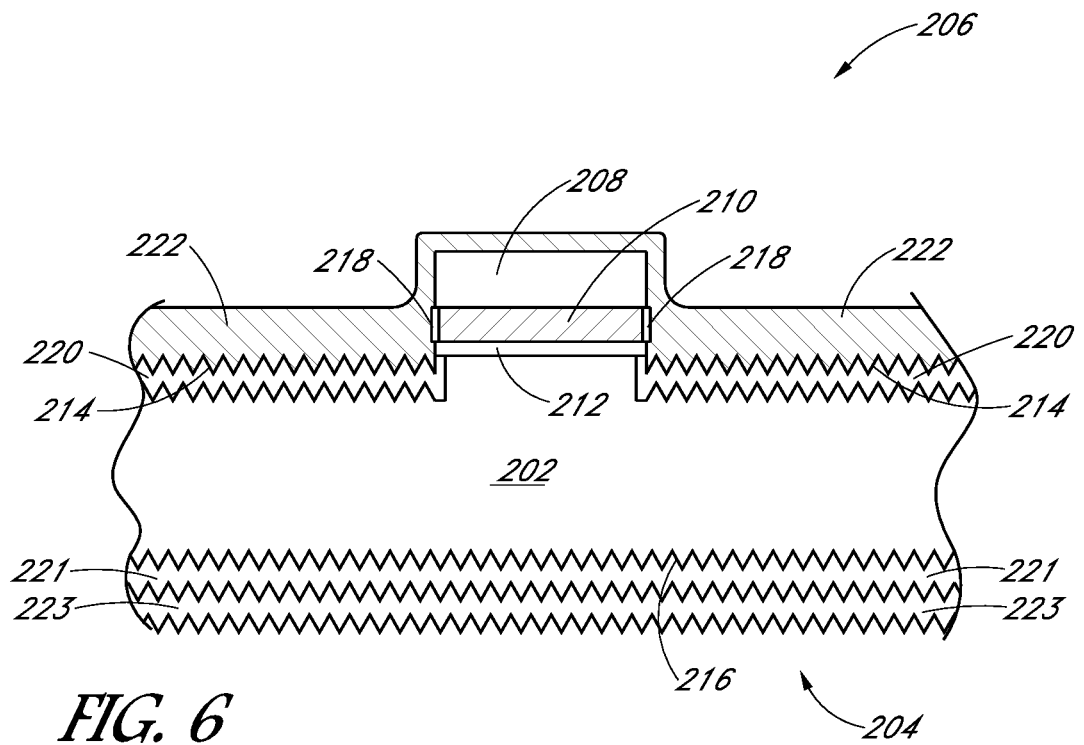

Referring again to FIG. 6 and now to corresponding operation 110 of the flowchart of FIG. 1, a second emitter region 222 of a second, different, conductivity type can be formed on the third dielectric region 220, and over the second dielectric region 218 and the insulating cap 208 of the first emitter region 210, according to some embodiments. In an embodiment, the second emitter region 222 can be an amorphous silicon region. In some embodiments, the amorphous silicon region can be grown. In an embodiment, the second emitter region 222 can be polysilicon. In an embodiment, the second emitter region 222 can be grown and/or formed through a thermal process. In an example, an amorphous silicon region can be formed over the surface of the substrate 202 and heated to form a polysilicon second emitter region 210. In one example, an annealing process can be performed to form the polysilicon second emitter region 210.

In an embodiment, the second emitter region 222 is a polycrystalline silicon that is doped to have the second conductivity type either through in situ doping, post deposition implanting, or a combination thereof, among other examples. In another embodiment, the second emitter region 222 is an amorphous silicon such as a hydrogenated silicon represented by a-Si:H which is implanted with dopants of the second conductivity type subsequent to deposition of the amorphous silicon. In one such embodiment, the second emitter region 222 can be subsequently annealed (at least at some subsequent stage of the process flow) to ultimately form a polycrystalline silicon (e.g., forming the second emitter region 222, the second emitter region 222 comprising polysilicon). In an embodiment, for either a polycrystalline silicon or an amorphous silicon, if post deposition implantation is performed, the implanting can be performed by using ion beam implantation or plasma immersion implantation. In one such embodiment, a shadow mask can be used for the implanting. In a specific embodiment, the second conductivity type is N-type (e.g., formed using phosphorus atoms or arsenic impurity atoms).

In an embodiment, a fourth dielectric region 221 can be formed at the front side 204 of the substrate 202, in the same or similar process operations, as those discussed for the first, second and third dielectric regions 212, 218, 220. In one example, the fourth dielectric region 221 can be of the same material as the first, second and/or third dielectric regions 212, 218, 220. A third emitter region 223 can also be formed at the front side 204 of the substrate 202, in the same or similar process operations, as those discussed for the first and second emitter regions 210, 222. In one example, the third emitter region 223 can be of the same material as the first and/or second emitter region 210, 222. Additionally, although not depicted, an anti-reflective region (ARC) region can be formed on the front and/or back side 204, 206 of the substrate 202.

Figure 7:
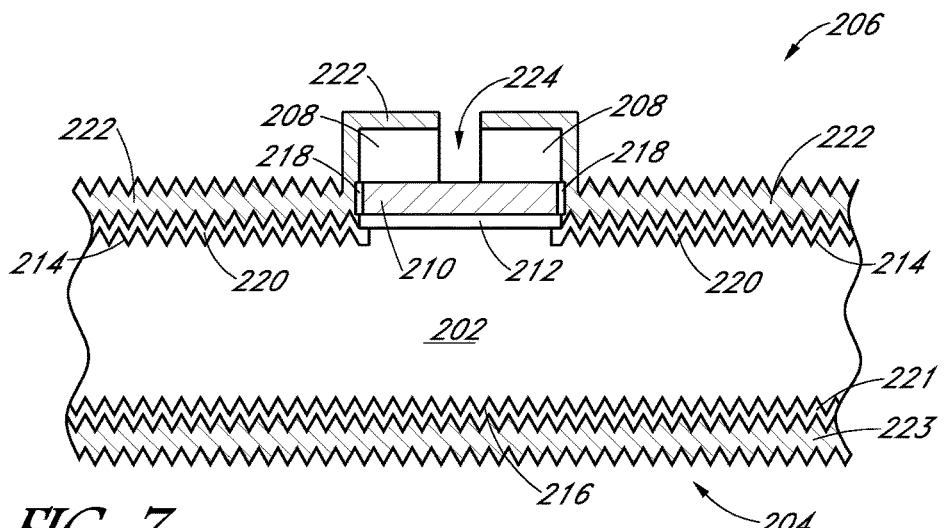

FIG. 7 illustrates, and now to corresponding operation 112 of the flowchart of FIG. 1, patterning the second emitter region 222 and insulating cap 208 to form contact openings 224 to expose portions of the first emitter region 210. In an embodiment, the insulating cap 208 can be patterned using a laser ablation process.

In one embodiment, the patterning can be performed before forming the second emitter region 222, such that only the insulating cap 208 is patterned and a portion of the second emitter region 222 is formed over an exposed portion of the first emitter region 210. In an example, a laser ablation process can be performed on the insulating cap 208 to form the contact opening 224 and, as a result, the second emitter region can be formed on the first emitter region 210 within the contact opening 224 subsequent to the laser ablation process.

Figure 8:
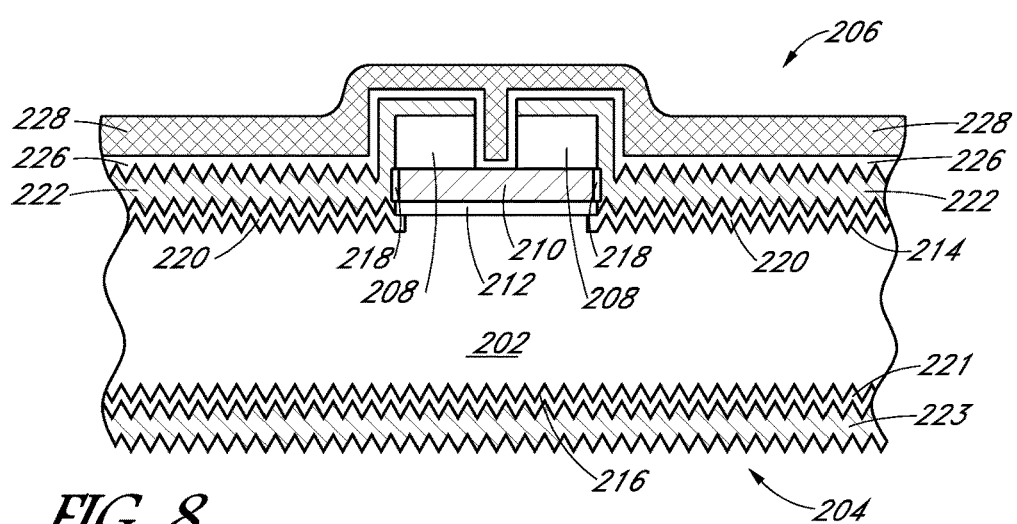

With reference to FIG. 8, and now to corresponding operation 114 of the flowchart of FIG. 1, a metal seed region 226 can be formed over the first and second emitter regions 210, 222. In an embodiment, the metal seed region 226 is aluminum, aluminum/Si, nickel, silver, cobalt, tungsten, titanium, copper, transparent conductive oxide (TCO), and alloys thereof. In some embodiments, the metal seed region 226 is formed by blanket deposition. In one embodiment, the metal seed region 226 can be patterned. In an example, the metal seed region 226 can have an interdigitated pattern. In an embodiment, the metal seed region 226 can have a thickness less than or equal to 5 μm. In one embodiment, the metal seed region 226 need not be formed.

Figure 9:
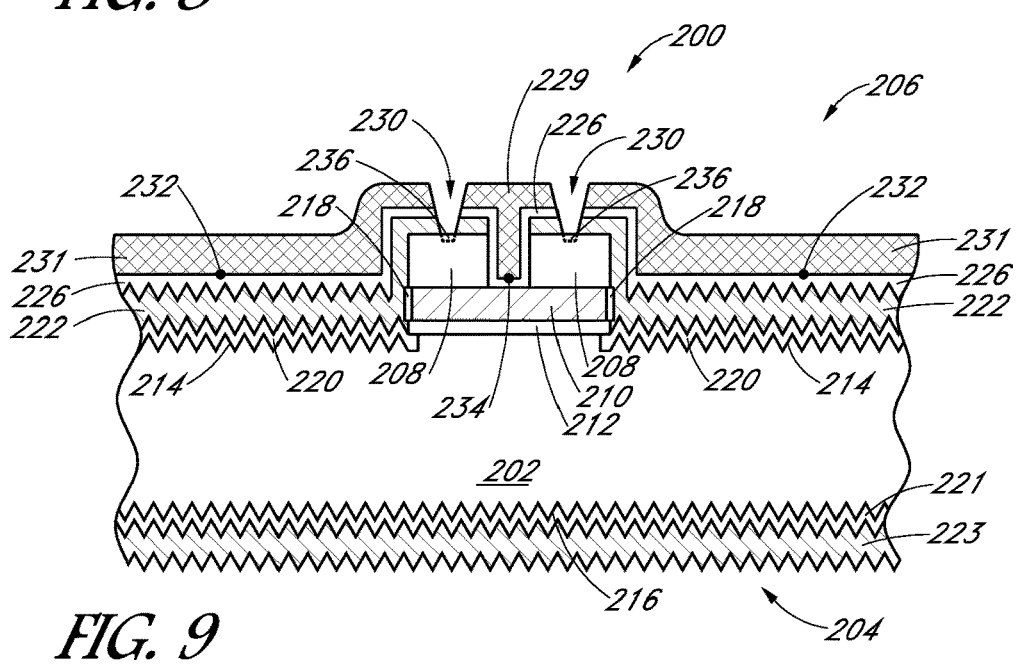
FIG. 9 illustrates a cross-sectional view of an example solar cell, according to some embodiments.

Referring again to FIG. 8, and now to corresponding operation 116 of the flowchart of FIG. 1, a metal region 228 can be formed over the first and second emitter regions 210, 222. In an embodiment, the metal region 228 can be formed on the metal seed region 226. In one embodiment, the metal region 228 can be continuous (e.g., not patterned metal). In one embodiment, the metal region 228 can be formed by bonding a metal (e.g., an aluminum or an aluminum alloy) to the metal seed region 226. In an embodiment, an electrically conductive medium, such as an adhesive or solder, can be used in the bonding process. In an example, the metal region 228 can be electrically glued to the metal seed region 226. In an embodiment, the bonding process can include resistive bonding or laser welding, ultrasonic, or thermocompression processes. In an embodiment, the bonding can include directly coupling portions of the metal region 228 with corresponding portions of the metal seed region 226. In one such embodiment, the direct coupling of portions of the metal region 228 with corresponding portions of the metal seed region 226 involves forming a metal bond region 232, 234 at each of such locations, as is depicted in FIG. 9. In an embodiment, the metal region 228 is a metal foil (e.g., an aluminum foil).

In an embodiment, the metal region 228 can be formed by performing a plating process. In an example, a plating process can be used to plate the metal region 228 onto the metal seed region 226. In one embodiment, the metal region 228 is copper or a copper alloy. In an embodiment, the metal region 228 can have a thickness greater than 5 μm.

In one embodiment, the metal region 228 can be formed directly over the first and second emitter region 210, 222 instead of forming the metal seed region 226.

Referring to FIG. 9, and now to corresponding operation 118 of the flowchart of FIG. 1, the metal region 228, metal seed region 226 and second emitter region 222 are patterned to separate the first emitter region 210 of a first conductivity type from the second emitter region 222 of a second, different, conductivity type. In an embodiment, the patterning forms a first metal contact 229 coupled to the first emitter region 210 and a second metal contact 231 coupled to the second emitter region 222. In an embodiment, the patterning includes performing a laser ablation process on the metal region 228, metal seed region 226 and second emitter region 222 at locations above the insulating cap 208 of the first emitter region 210. In an example, the laser ablation process can ablate through the metal region 228, metal seed region 226 and second emitter region 222 to separate the first emitter region 210 of a first conductivity type from the second emitter region 222 of a second, different, conductivity type, where the patterning forms the first and second metal contact 229, 231. In an embodiment, the first and second metal contact 229, 231 are a first and second metal foil (e.g., an aluminum foil).

In one embodiment, the patterning includes performing a wet etching process. In an example, the patterning can use an alkaline etchant to etch the metal region 228, metal seed region 226 and the second emitter region 222. In an embodiment, the wet etching is selective against the insulating region 208, e.g., the insulating region 208 is not etched away after performing the wet etching process.

In an embodiment the patterning includes using a mechanical method such as kiss cut or diamond tip cutter.

In an embodiment, the metal region 228, the metal seed region 226 and second emitter region 222 are patterned in the same step and/or process. In an embodiment, the first metal contact 229 can be of a positive conductivity type and the second metal contact 231 can be of a negative conductivity type. In an embodiment, the first metal contact 229 is physically disconnected, e.g., not in physical contact, from the second metal contact 231. In one embodiment, the first metal contact 229 can be electrically isolated from the second metal contact 231.

Instead of forming the metal seed region 226, the metal region 228 can be formed directly over the second emitter region 222. In one such embodiment, the metal region 228 and the second emitter region 222 can be patterned to separate the first emitter region 210 of a first conductivity type from the second emitter region 222 of a second, different, conductivity type. In an example, a laser ablation process can ablate through the metal region 228 and second emitter region 222 to separate the first emitter region 210 of a first conductivity type from the second emitter region 222 of a second, different, conductivity type, where the patterning forms the first and second metal contact 229, 231. In an example, a wet etching process can etch through the metal region 228 and second emitter region 222 to separate the first emitter region 210 of a first conductivity type from the second emitter region 222 of a second, different, conductivity type, where the patterning forms the first and second metal contact 229, 231. In an example, the first and second metal contact 229, 231 can be formed directly over the first and second emitter region 210.

In an embodiment, the insulating cap 208 can serve as a damage buffer to protect the underlying emitter structures (e.g., first emitter region 210) from damage during the laser ablation process. In various embodiments, the insulating cap 208 can be a reflecting or absorbing film, to prevent damage to the underlying emitter region by absorbing excess laser radiation at portions 236 of the insulating cap 208. In one such embodiment, the laser ablating can be performed using an infra-red (IR) laser, and forming the laser reflecting or absorbing film involves forming a magenta film. More generally, it can be appreciated that embodiments involve the use of a film color that can be designed in accordance with the laser being used. In one such example, the laser can have a wavelength greater than 155 nm. In such an approach, the film color can be selected to target direct or indirect ablation depending on the refractive index and absorption coefficient of the films. In the particular embodiment described, use of a magenta film means it absorbs green and reflects blue and red. In an embodiment, a top film that can be transparent to the laser light is applied to the insulating cap 208. In another embodiment, the insulating cap 208 can absorb approximately or greater than 85% of a laser pulse.

In an embodiment, the laser ablation can be performed mask-free; however, in other embodiments, a mask region can be formed prior to laser ablating, and is removed subsequent to laser ablating. In an embodiment, the same laser can be used to bond the metal region 228 to the metal seed region 226 and for the laser ablation process.

In one embodiment, the metal seed region 226 can be patterned separately from the metal region 228 and second emitter region 222. In an example, a patterned metal seed region can be formed. In another example, the metal seed region 226 need not be formed. In an embodiment, the metal region 228 and the second emitter region 222, e.g., with a patterned metal seed region or without the metal seed region 226, are patterned during the patterning process to form the isolated second emitter region 228 and first and second metal contact 229, 231.

With reference to FIG. 9, a solar cell formed from the method of FIGS. 1-8 is shown, according to some embodiments. The solar cell 200 can have a front side 204 which faces the sun during normal operation and a back side 206 opposite the front side 204. The solar cell 200 includes a substrate 202. In an embodiment, the substrate 202 can be a N-type silicon substrate.

In an embodiment, a first dielectric region 212 is disposed on the substrate 202. In an embodiment, the first dielectric region 212 can be a tunneling dielectric. In one embodiment, the first dielectric region 212 can be silicon oxide, silicon nitride or silicon oxynitride among other examples. In an embodiment, the first dielectric region 212 can have a thickness of 5-30 Angstroms.

In an embodiment, a first emitter region 210 is disposed on the first dielectric region 212. In one embodiment, the first emitter region 210 can be an amorphous silicon region. In an embodiment, the first emitter region 210 can be polysilicon. In an embodiment, the first emitter region 210 is of a first conductivity type. In an example, the first emitter region 210 has a conductivity type that is P-type.

In an embodiment, an insulating cap 208 is disposed over the first emitter region 210. In an embodiment the insulating cap 208 includes silicon oxide. In one embodiment, a portion 236 of the insulating cap 208 is partially damaged and/or removed due to laser ablation (e.g., from the patterning step 118 of FIG. 1). In an embodiment, the insulating cap 208 has a thickness in the range of 1000-4000 Angstroms. In an embodiment, a second dielectric region 218 is located adjacent to and/or laterally between the first emitter region 212 and a second emitter region 222. In an embodiment, the second dielectric region 218 is a thin silicon nitride or silicon oxynitride. In an example, the silicon nitride and/or silicon oxynitride can have a thickness of approximately 40 Angstroms or less. In an embodiment, the second dielectric region 218 is formed in an oxidation process and is a thin oxide such as a tunnel dielectric (e.g., silicon oxide). In an example, the silicon oxide has a thickness of approximately 2 nanometers or less.

In an embodiment, a third dielectric region 220 is disposed on the substrate 202. In an embodiment, the third dielectric region 220 can be a tunneling dielectric. In one embodiment, the third dielectric region 220 can be silicon oxide, silicon nitride or silicon oxynitride among other examples. In an embodiment, the third dielectric region 220 can have a thickness of 5-30 Angstroms.

In some embodiments, portions of the back and front surface of the substrate 202 can be texturized 214, 216. A texturized surface may be one which has a regular or an irregular shaped surface for scattering incoming light, decreasing the amount of light reflected off of the light-receiving and/or exposed surfaces of the solar cell 200. Additionally, although not depicted, an anti-reflective region (ARC) region can be formed on the front and/or back side 204, 206 of the substrate 202.

In an embodiment, a fourth dielectric region 221 is disposed at the front side 204 of the substrate 202. In an embodiment, the fourth dielectric region 221 can be a tunneling dielectric. In one embodiment, the fourth dielectric region 221 can be silicon oxide, silicon nitride or silicon oxynitride among other examples. In an embodiment, the fourth dielectric region 221 can have a thickness of 5-30 Angstroms.

In an embodiment, a second emitter region 222 is disposed on the third dielectric region 220 and/or insulating cap 208. In an embodiment, the insulating cap 208 can physically and/or electrically separate the second emitter region 222 from the first emitter region 210. In an embodiment, the second emitter region 222 is of a second, different, conductivity type to the first emitter region 210. In an example, the first emitter region 210 can have a conductivity type that is P-type and the second emitter region 222 can have a conductivity type that is N-type. In one embodiment, the second emitter region 222 can be an amorphous silicon region. In an embodiment, the second emitter region 222 can be polysilicon.

In an embodiment, a third emitter region 223 is disposed at the front side 204 of the substrate 202. In one embodiment, the third emitter region 223 can be an amorphous silicon region. In an embodiment, the third emitter region 223 can be polysilicon. In an embodiment, the third emitter region 223 is of a second conductivity type. In an example, the third emitter region 223 has a conductivity type that is N-type.

In an embodiment, a first metal contact 229 is disposed over the first emitter region 210. In an embodiment, a second metal contact 231 is disposed over the second emitter region 222. In one embodiment, the first and second metal contact can be an aluminum, an aluminum alloy, copper or a copper alloy. In an embodiment, both the first and/or second metal contact 229, 231 are disposed over both the first and/or second emitter regions 210, 222, respectively. In an embodiment, the first and second metal contact 229, 231 are the same material. In an embodiment, the first and/or the second metal contact 229, 231 are a first and second metal foil (e.g., aluminum foil). In an embodiment, a separation region 230 can physically and/or electrically separate the first metal contact 229 from the second metal contact 231. In an example, the first metal contact 229 can have P-type metal fingers and the second metal contact 231 can have N-type metal fingers separated by the separation region 230.

In some embodiments, a metal seed region 226 can be disposed between the first metal contact 229, second metal contact 231 and the second emitter region 222. In one embodiment, the metal seed region 226 can be a metal such as, but not limited to, nickel, silver, cobalt or tungsten. In one embodiment, the first and second metal contact 229, 231 can be bonded, at bond locations 232, 234, to the metal seed region 226.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A method of fabricating a solar cell, the method comprising:
    forming a first emitter region of a first conductivity type on a first dielectric region formed on a surface of a substrate, the first emitter region having an insulating cap thereon;
    forming a second dielectric region adjacent to exposed sides of the first emitter region;
    forming a second emitter region of a second, different, conductivity type on a third dielectric region formed on the surface of the substrate, and over the second dielectric region and the insulating cap of the first emitter region;
    forming a contact opening in the second emitter region and in the insulating cap, wherein the contact opening exposes a portion of the first emitter region;
    forming a metal region over the first and second emitter regions, the metal region comprising a metal foil; and
    patterning the metal region and the second emitter region to form a first metal contact comprising a first metal foil portion in the contact opening and coupled to the portion of the first emitter region and a second metal contact comprising a second metal foil portion coupled to the second emitter region.

2. The method of claim 1, wherein patterning the metal region and second emitter region comprises performing a wet etching process to pattern the metal region and second emitter region.

3. The method of claim 2, wherein performing the wet etching process to pattern the metal region and second emitter region comprises performing the wet etching process using an alkaline etchant to etch the metal region and second emitter region.

4. The method of claim 1, wherein prior to forming the metal region, forming a metal seed region over the second emitter region, wherein the patterning the metal region and the second emitter region includes patterning the metal seed region.

5. The method of claim 4, further comprising bonding the metal region to the metal seed region.

6. The method of claim 1, wherein the first and second emitter region are formed as amorphous silicon regions, the method further comprising:

annealing a first and second amorphous silicon regions to form first and second polysilicon emitter regions, respectively.

7. A method of fabricating a solar cell, the method comprising:
   forming a first emitter region of a first conductivity type on a first dielectric region formed on a surface of a substrate;
   forming an insulating region on the first emitter region;
   patterning the insulating region and the first emitter region to form a first emitter region of the first conductivity type having an insulating cap thereon;
   forming a second dielectric region adjacent to exposed sides of the first emitter region;
   forming a second emitter region of a second, different, conductivity type on a third dielectric region formed on the surface of the substrate, and over the second dielectric region and the insulating cap of the first emitter region;
   forming a contact opening in the second emitter region and in the insulating cap, wherein the contact opening exposes a portion of the first emitter region;
   forming a metal region over the first and second emitter region, the metal region comprising a metal foil; and
   laser ablating through the metal region and the second emitter region to form a first metal contact comprising a first metal foil portion in the contact opening and coupled to the portion of the first emitter region and a second metal contact comprising a second metal foil portion coupled to the second emitter region.

8. The method of claim 7, wherein laser ablating through the metal region and second emitter region comprises ablating a portion of the insulating cap.

9. The method of claim 7, wherein prior to forming the metal region, forming a metal seed region over the second emitter region, wherein the laser ablating through the metal region and the second emitter region includes laser ablating the metal seed region.

10. The method of claim 9, further comprising bonding the metal region to the metal seed region.

11. The method of claim 10, wherein the bonding comprises a method selected from the group consisting of plating, soldering, using an adhesive, laser welding, ultrasonic process and thermo-compression process.

12. The method of claim 10, wherein the laser ablating and the bonding are performed using the same laser.

13. The method of claim 7, wherein the laser ablating comprises using an infra-red (IR) laser.

14. The method of claim 7, wherein the laser ablating comprises using a laser having a wavelength greater than 155 nm.

* * * * *